(12) United States Patent
Hwan et al.

(10) Patent No.: US 7,772,698 B2
(45) Date of Patent: Aug. 10, 2010

(54) PACKAGE STRUCTURE FOR INTEGRATED CIRCUIT DEVICE

(75) Inventors: Lu-Chen Hwan, Taipei (TW); Yu-Lin Ma, Zhongli (TW); P. C. Chen, Zhubei (TW)

(73) Assignee: Mutual-Pak Technology Co., Ltd., Xinzhuang (TW)

( * ) Notice: Subject to any disclaimer, the term of this patent is extended or adjusted under 35 U.S.C. 154(b) by 0 days.

(21) Appl. No.: 12/116,152

(22) Filed: May 6, 2008

(65) Prior Publication Data

US 2008/0277785 A1    Nov. 13, 2008

(30) Foreign Application Priority Data

May 8, 2007    (TW) .............. 96116302 A

(51) Int. Cl.
 *H01L 23/48*    (2006.01)
 *H01L 23/52*    (2006.01)
 *H01L 29/40*    (2006.01)
 *H01L 23/28*    (2006.01)
 *H01L 23/02*    (2006.01)

(52) U.S. Cl. .............. 257/737; 257/686; 257/738; 257/787; 257/E23.021; 257/E23.133

(58) Field of Classification Search ......... 257/737–738, 257/787, E23.021, E23.133, 686
See application file for complete search history.

(56) References Cited

U.S. PATENT DOCUMENTS

| | | | | |
|---|---|---|---|---|
| 5,034,345 A | * | 7/1991 | Shirahata ............... | 438/613 |
| 6,316,952 B1 | * | 11/2001 | Ahmad et al. ........... | 324/755 |
| 6,593,658 B2 | * | 7/2003 | Huang et al. ........... | 257/773 |
| 6,844,957 B2 | * | 1/2005 | Matsumoto et al. ..... | 359/296 |
| 7,442,878 B2 | * | 10/2008 | Bernier et al. .......... | 174/260 |
| 2004/0155352 A1 | * | 8/2004 | Ma ........................ | 257/758 |
| 2004/0169286 A1 | * | 9/2004 | Shibata ................... | 257/777 |
| 2005/0077619 A1 | * | 4/2005 | Ramanathan et al. ... | 257/719 |
| 2005/0156297 A1 | * | 7/2005 | Farnworth et al. ...... | 257/678 |
| 2005/0242426 A1 | * | 11/2005 | Kwon et al. ............ | 257/690 |
| 2006/0275949 A1 | * | 12/2006 | Farnworth et al. ...... | 438/106 |
| 2007/0246819 A1 | * | 10/2007 | Hembree et al. ........ | 257/698 |
| 2007/0296068 A1 | * | 12/2007 | Schnetker .............. | 257/669 |
| 2008/0197474 A1 | * | 8/2008 | Yang et al. ............. | 257/690 |
| 2008/0213976 A1 | * | 9/2008 | Farnworth .............. | 438/460 |
| 2008/0315424 A1 | * | 12/2008 | Lee et al. ............... | 257/762 |
| 2009/0008778 A1 | * | 1/2009 | Lee et al. ............... | 257/738 |
| 2009/0011542 A1 | * | 1/2009 | Lee et al. ............... | 438/113 |
| 2009/0200651 A1 | * | 8/2009 | Kung et al. ............ | 257/685 |

* cited by examiner

*Primary Examiner*—Ida M Soward
(74) *Attorney, Agent, or Firm*—Snell & Wilmer L.L.P.

(57) ABSTRACT

A package structure for packaging at least one of a plurality of integrated circuit devices of a wafer is provided. The package structure includes an extension metal pad, a first conductive bump and an insulator layer. The extension metal pad electrically contacts the at least one of the plurality of integrated circuit devices. The first conductive bump is located on the extension metal pad. The insulator layer is located over the at least one of the plurality of integrated circuit devices and on a sidewall of it.

8 Claims, 8 Drawing Sheets

__US 7,772,698 B2__

PACKAGE STRUCTURE FOR INTEGRATED CIRCUIT DEVICE

CROSS REFERENCE TO RELATED APPLICATIONS

This application claims the right of priority based on Taiwan Patent Application No. 96116302 entitled "Package structure for integrated circuit device and method of the same," filed on May 8, 2007, which is incorporated herein by reference and assigned to the assignee herein.

FIELD OF THE INVENTION

This invention relates to a package structure for integrated circuit devices and a method of the same, and more particularly, relates to a wafer level package structure for integrated circuit devices and a method of the same.

BACKGROUND OF THE INVENTION

In a conventional wafer level package process, package materials are only applied on the top of the wafer. After the packaging step, the wafer is cut into multiple chips and therefore the sidewall of each chip is exposed without being protected by the package materials.

Accordingly, it is desired to provide a package structure for integrated circuit device and a method of forming the same, in which the sidewall of the integrated circuit device is protected.

SUMMARY OF THE INVENTION

In light of the foregoing, it is one object of the present invention to provide package structures for integrated circuit devices and a method of the same in which the sidewalls of the integrated circuit devices is protected.

One aspect of the present invention is to provide a package structure. The package structure includes a wafer having a plurality of integrated circuit devices, at least one groove, an extension metal pad, a first conductive bump, and an insulator layer. The at least one groove is in the wafer for cutting the wafer. The extension metal pad electrically contacts at least one of the plurality of integrated circuit devices. The first conductive bump is on the extension metal pad. The insulator layer is over the at least one of the plurality of integrated circuit devices and in the at least one groove. The insulator layer covers a sidewall of the at least one of the plurality of integrated circuit devices.

Materials for the extension metal pad may be titanium (Ti), an alloy of titanium and tungsten (TiW), chromium (Cr), copper (Cu), or combinations thereof. Materials for the insulator layer pad may be epoxy, polyimide, benzocycle butane, a liquid crystal polymer, or combinations thereof. The insulator layer may be formed by a printing process.

The package structure may further include a second conductive bump on the first conductive bump, and a surface metal layer on the second conductive bump. At least one of the first conductive bump and the second conductive bump may include a plurality of metal particles and a polymer compound, or pure metal. The plurality of metal particles may be made of copper, nickel, silver, gold, or combinations thereof. A size of each metal particle may be in a range of 1 to 10 micrometers (μm). Polymer compound can be epoxy, a liquid crystal polymer, or combinations thereof. A volume ratio of the plurality metal particles to the polymer compound is greater than 85:15. The first conductive bump and the second conductive bump may be formed by a printing process. Materials for the surface metal layer may be nickel, gold, or combinations thereof.

The package structure further includes a metal wall on the first conductive bump. Materials for the metal wall may include nickel, copper, gold, or combinations thereof.

The package structure may further include a metal pad between the at least one of the plurality of integrated circuit devices and the extension metal pad. The metal pad can electrically connect the extension metal pad and the at least one of the plurality of the integrated circuit devices. An area of the extension metal pad is bigger than an area of the metal pad. The package structure may further include a passivation layer between the at least one of the plurality of integrated circuit devices and the extension metal pad. A material of the metal pad may be aluminum (Al). The passivation layer may be made of silicon oxynitride (SiNO).

Another aspect of the present invention is to provide a package structure for packaging at least one of a plurality of integrated circuit devices of a wafer. The package structure includes an extension metal pad, a first conductive bump, and an insulator layer. The extension metal pad electrically contacts the at least one of the plurality of integrated circuit devices. The first conductive bump is on the extension metal pad. The insulator layer is over the at least one of the plurality of integrated circuit devices and on a sidewall of the at least one of the plurality of integrated circuit devices.

A material of the extension metal pad may include titanium, an alloy of titanium and tungsten, chromium, copper, or combinations thereof. Materials for the insulator layer may include epoxy, polyimide, benzocycle butane, a liquid crystal polymer, or combinations thereof. The insulator layer may be formed by a printing process.

The package structure may further include a second conductive bump on the first extension metal pad, and a surface metal layer on the second conductive bump. At least one of the first conductive bump and the second conductive bump may include a plurality of metal particles and a polymer compound. The plurality of metal particles may be made of copper, nickel, silver, gold, or combinations thereof. A size of each metal particle may be in a range of 1 to 10 micrometers. Polymer compound can be epoxy, a liquid crystal polymer, or combinations thereof. A volume ratio of the plurality metal particles to the polymer compound is greater than 85:15. The first conductive bump and the second conductive bump may be formed by a printing process. A material of the surface metal layer may include nickel, gold, or combinations thereof.

The package structure may further include a metal wall on the first conductive bump. Materials for the metal wall may include nickel, copper, gold, or combinations thereof.

The package structure may further include a metal pad between the at least one of the plurality of integrated circuit devices and the extension metal pad. The metal pad can electrically connect the extension metal pad and the at least one of the plurality of the integrated circuit devices. Furthermore, an area of the extension metal pad is bigger than an area of the metal pad. The package structure may further include a passivation layer between the at least one of the plurality of integrated circuit devices and the extension metal pad. A material of the metal pad may include aluminum (Al). The passivation layer may be made of silicon oxynitride (SiNO).

Another aspect of the present invention is to provide a method of forming a package structure for packaging at least one of a plurality of integrated circuit devices of a wafer. The method includes forming at least one groove in the wafer; forming an extension metal pad electrically contacting the at least one of the plurality of integrated circuit devices; forming a first conductive bump on the extension metal pad; and forming an insulator layer over the plurality of integrated circuit devices and in the at least one groove. Subsequently, the wafer is cut at the at least one groove to obtain a plurality of packaged chips, wherein the insulator layer covers a sidewall of the at least one of the plurality of intergraded circuit devices.

The foregoing method of forming the package structure may further include assembling at least one of the plurality of packaged chips to a substrate having an interconnect structure. Materials for the interconnect structure may include a solder, a silver paste, or combinations thereof. The substrate may be a flexible printed circuit (FPC), a printed circuit board (PCB), or ceramics. The step of assembling may include bonding the at least one of plurality of packaged chips on the interconnect structure by a surface mounting technique (SMT).

Materials for the extension metal pad may be titanium, an alloy of titanium and tungsten, chromium, copper, or combinations thereof. Materials for the insulator layer may include epoxy, polyimide, benzocycle butane, a liquid crystal polymer, or combinations thereof. The step of forming the insulator layer over the plurality of integrated circuit devices and in the at least one groove may include printing an insulator layer over the plurality of integrated circuit devices and in the at least one groove.

Alternatively, the foregoing method of forming the package structure may further include forming a second conductive bump on the first conductive bump, and forming a surface metal layer on the second conductive bump. At least one of the step of forming the first conductive bump on the extension metal pad and the step of forming the second conductive bump on the first conductive bump may include forming a conductive bump having a plurality of metal particles and a polymer compound. The plurality of metal particles may be copper, nickel, silver, gold, or combinations thereof. A size of each metal particle may be in a range of 1 to 10 micrometers. The polymer compound may be made of epoxy, a liquid crystal polymer, or combinations thereof. A volume ratio of the plurality metal particles to the polymer compound may be greater than 85:15. The step of forming the first conductive bump on the extension metal pad and the step of forming the second conductive bump on the first conductive bump may include printing the first conductive bump on the extension metal pad and printing the second conductive bump on the first conductive bump, respectively. Materials for the surface metal layer may be nickel, gold, or combinations thereof.

The foregoing method of forming the package structure may further include forming a metal wall on the first conductive bump. Materials for the metal wall may include nickel, copper, gold, or combinations thereof.

The foregoing method of forming the package structure may further include forming a metal pad between the at least one of the plurality of integrated circuit devices and the extension metal pad. The metal pad can electrically connect the extension metal pad and the at least one of the plurality of the integrated circuit devices. Moreover, an area of the extension metal pad is bigger than an area of the metal pad. Additionally, the foregoing method of forming the package structure may further include forming a passivation layer between the at least one of the plurality of integrated circuit devices and the extension metal pad. A material of the metal pad may be aluminum (Al). Materials for the passivation layer may be silicon oxynitride (SiNO).

The objects and the features of the present invention may best be understood by reference to the detailed description with the accompanying drawings.

DETAILED DESCRIPTION OF THE INVENTION

FIG. 1A to FIG. 1H are cross-sectional views illustrating a method of forming a package structure 100 in accordance with an embodiment of the present invention, and the package structure 100 formed by the method. The package structure 100 is for packaging at least one of a plurality of integrated circuit devices of a wafer.

Figure 1A:
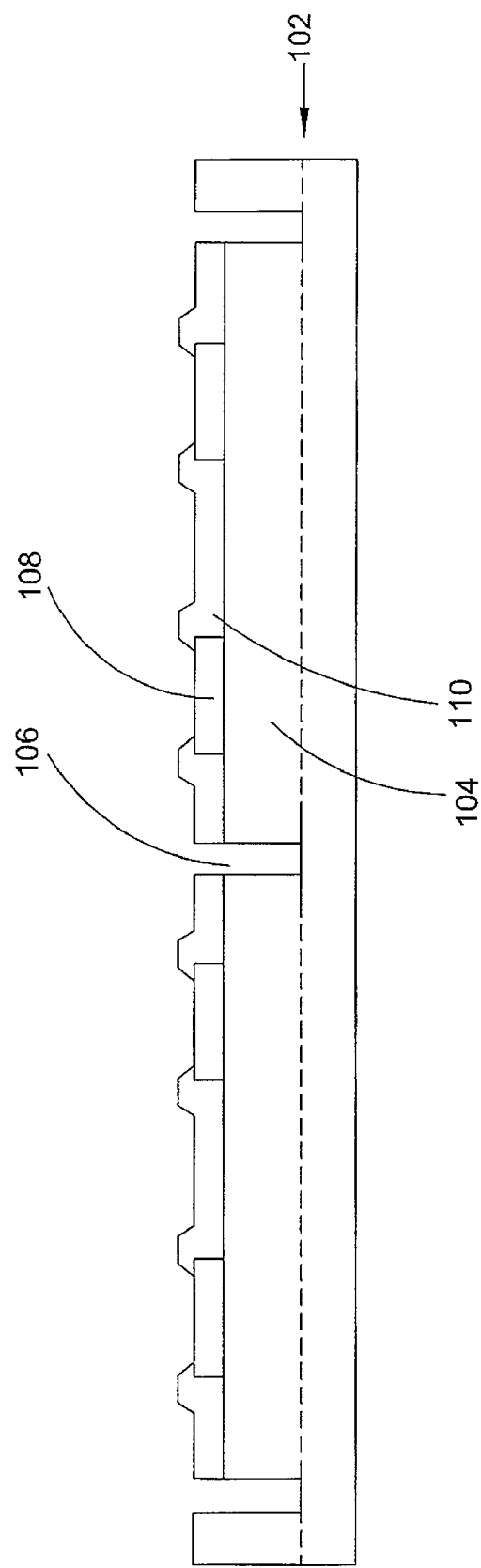
FIG. 1A to FIG. 1H are cross-sectional views illustrating a method of forming a package structure in accordance with an embodiment of the present invention.

First, referring to FIG. 1A, the wafer 102 has a plurality of the integrated circuit devices 104, a metal pad 108 and a passivation layer 110. The metal pad 108 and the passivation layer 110 are formed on the plurality of the integrated circuit devices 104. The present invention is described below by one integrated device 104, but is not limited thereto. In the illustrated embodiment, the method includes forming at least one groove 106 in the wafer 102. In this embodiment, the groove 106, namely a scribe line, is used to divide the wafer into multiple chips.

Figure 1B:
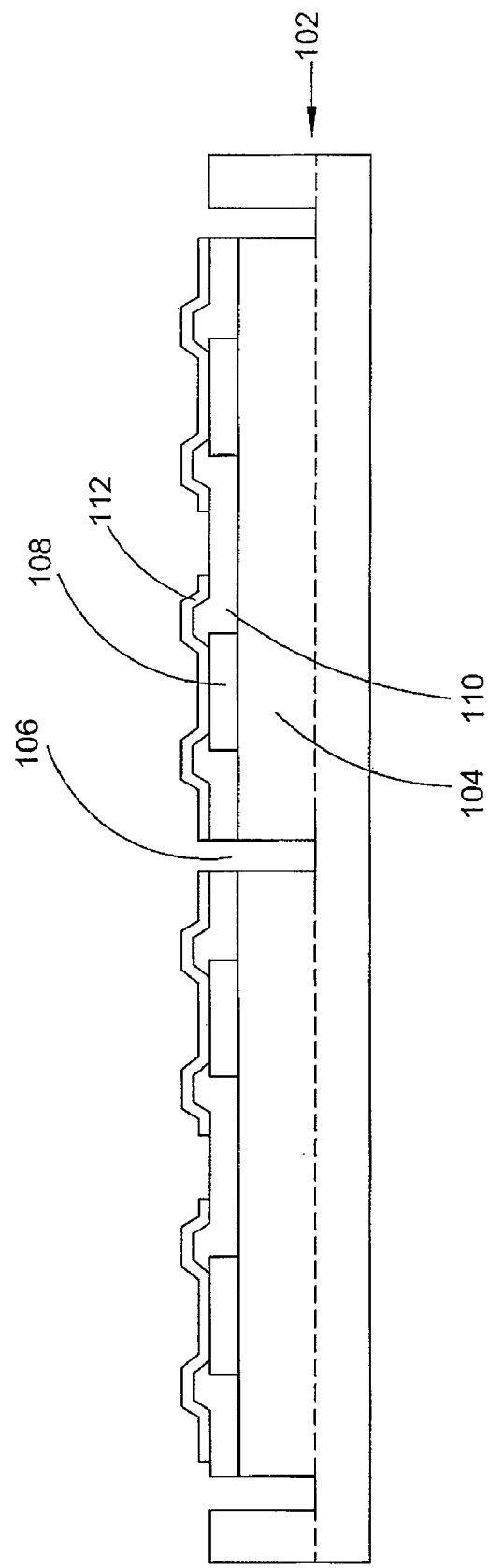

Subsequently, referring to FIG. 1B, an extension metal pad 112 is formed to electrically contact the integrated circuit device 104. In this embodiment, the extension metal pad 112 is connected to the integrated circuit device 104 via the metal pad 108, and an area of the extension metal pad 112 is bigger than that of the metal pad 108. The extension metal pad 112 may be made of titanium, an alloy of titanium and tungsten, chromium, copper, or combinations thereof, or any material which can electrically contact the integrated circuit devices 104. The metal pad 108 may be made of aluminum, or any material which can electrically connect the extension metal pad 112 to the integrated circuit device 104. The passivation layer 110 is made of silicon oxynitride (SiNO), or any materials for protecting the integrated circuit device 104.

Figure 1C:
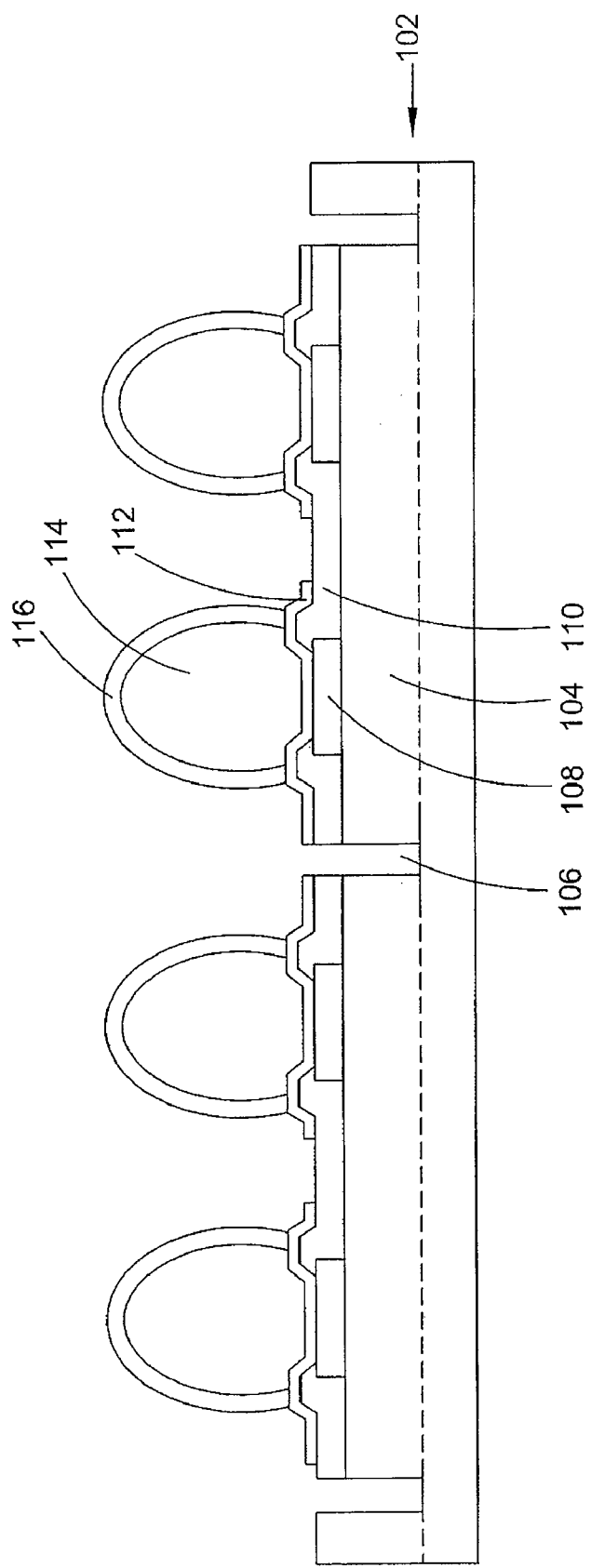

In FIG. 1C, a first conductive bump 114 is formed on the extension metal pad 112. The first conductive bump 114 may optionally include a plurality of metal particles and a polymer compound, or pure metal. The plurality of metal particles may be made of copper, nickel, silver, gold, or combinations thereof, but not limited thereto. A size of each metal particle may be in a range of 1 to 10 micrometers. The polymer compound may be made of epoxy, a liquid crystal polymer, or combinations thereof, but not limited thereto. A volume ratio of the plurality metal particles to the polymer compound is greater than 85:15. The step of forming the first conductive bump 114 on the extension metal pad 112 may be formed by a printing process.

In an embodiment, the method may also include optionally forming a metal wall 116 on the first conductive bump 114. The metal wall 116 can enhance the conductivity of the first conductive bump 114. Materials for the metal wall 116 may include nickel, copper, gold, or combinations thereof.

Figure 1D:
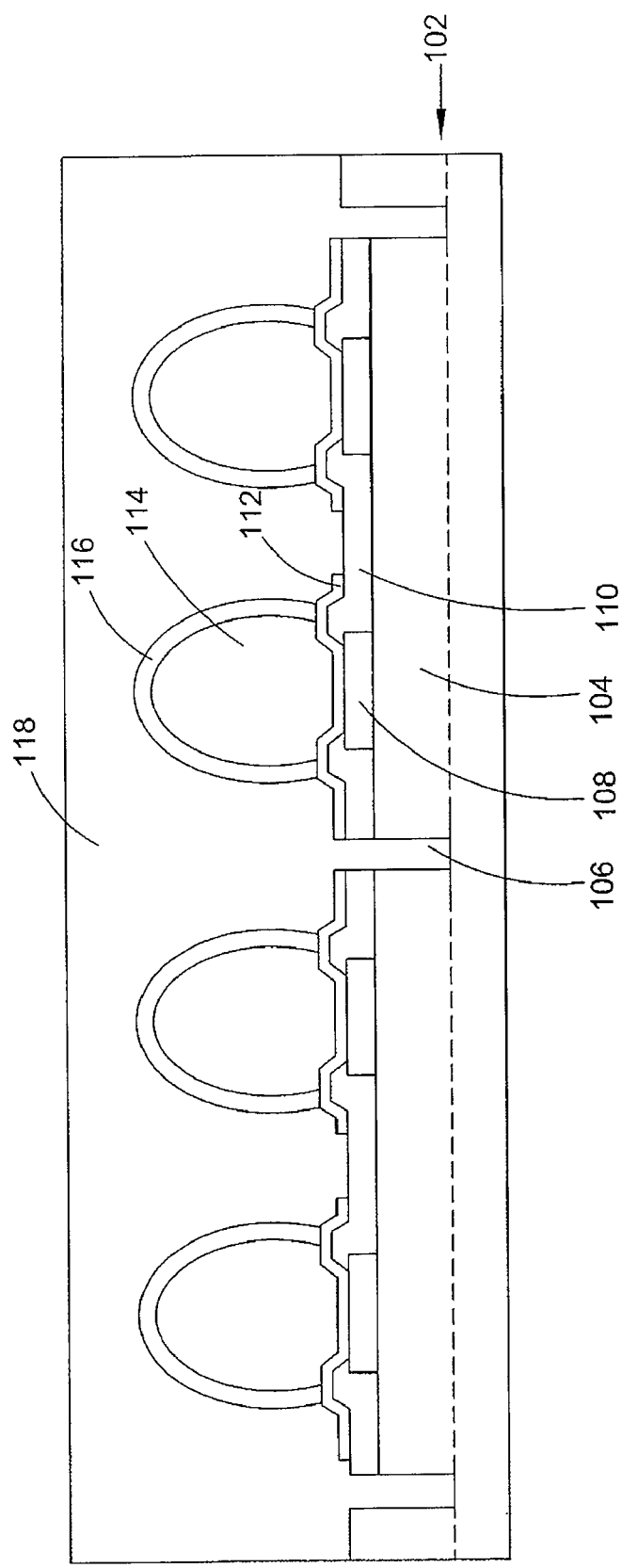

Then, referring to FIG. 1D, an insulator layer 118 is formed over the integrated circuit device 104 and in the groove 106. In this embodiment, the insulator layer 118 may also be formed over the sidewall of the first conductive bump 114 optionally covered with metal wall 116 and the extension metal pad 112. Because the groove 106 is adjacent to the integrated circuit device 104, the insulator layer 118 filled in the groove will 106 will cover the sidewall of the integrated circuit device 104 after the wafer is divided to multiple chips, such that the integrated circuit device 104 is entirely protected. The insulator layer 118 may be made of epoxy, polyimide, benzocycle butane, a liquid crystal polymer, or combinations thereof, or any material for protecting the integrated circuit device 104. The insulator layer 118 may be formed by a printing process.

Figure 1E:
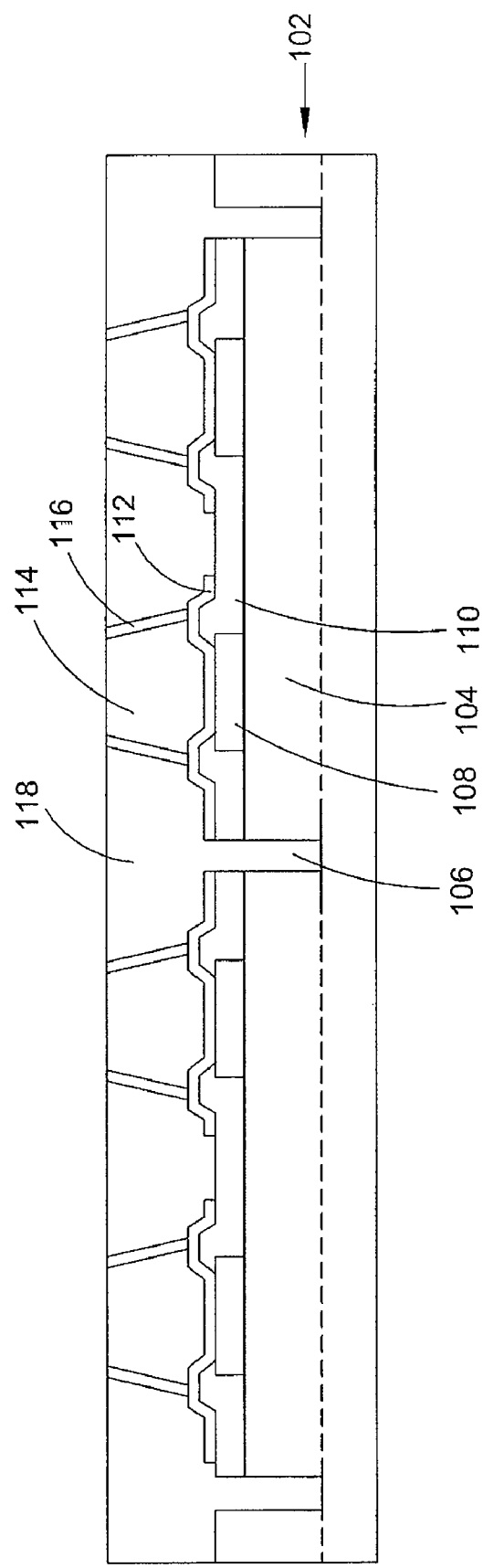
Figure 1F:
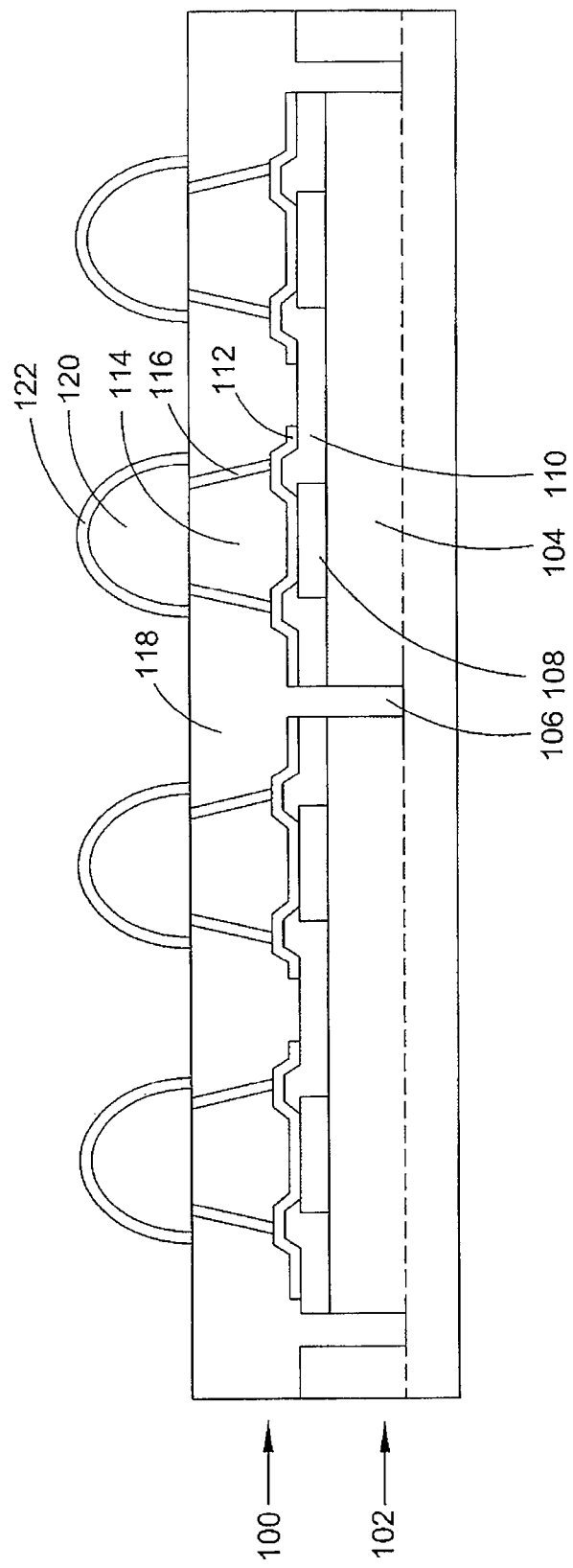

Referring to FIG. 1E, in the embodiment, the method may include removing a portion of the insulator layer 118 to expose the first conductive bump 114. Referring to FIG. 1F, subsequently, a second conductive bump 120 is formed on the first conductive bump 114, and a surface metal layer 122 is optionally formed on the second conductive layer 120, so that an exemplary packaged structure 100 is obtained. The second conductive bump 120 may optionally include a plurality of metal particles and a polymer compound. The plurality of metal particles can be made of copper, nickel, silver, gold, or combinations thereof. A size of each metal particle may be in a range of 1 to 10 micrometers ($\mu m$). Polymer compound can be epoxy, a liquid crystal polymer, or combinations thereof. A volume ratio of the plurality metal particles to the polymer compound is greater than 85:15. The step of forming the second conductive bump 120 on the first conductive bump 114 may be conducted by a printing process. The surface metal layer 122 may be made of nickel, gold, or combinations thereof, or any material which can facilitate the connections of the package structure 100 with other devices.

Figure 1G:
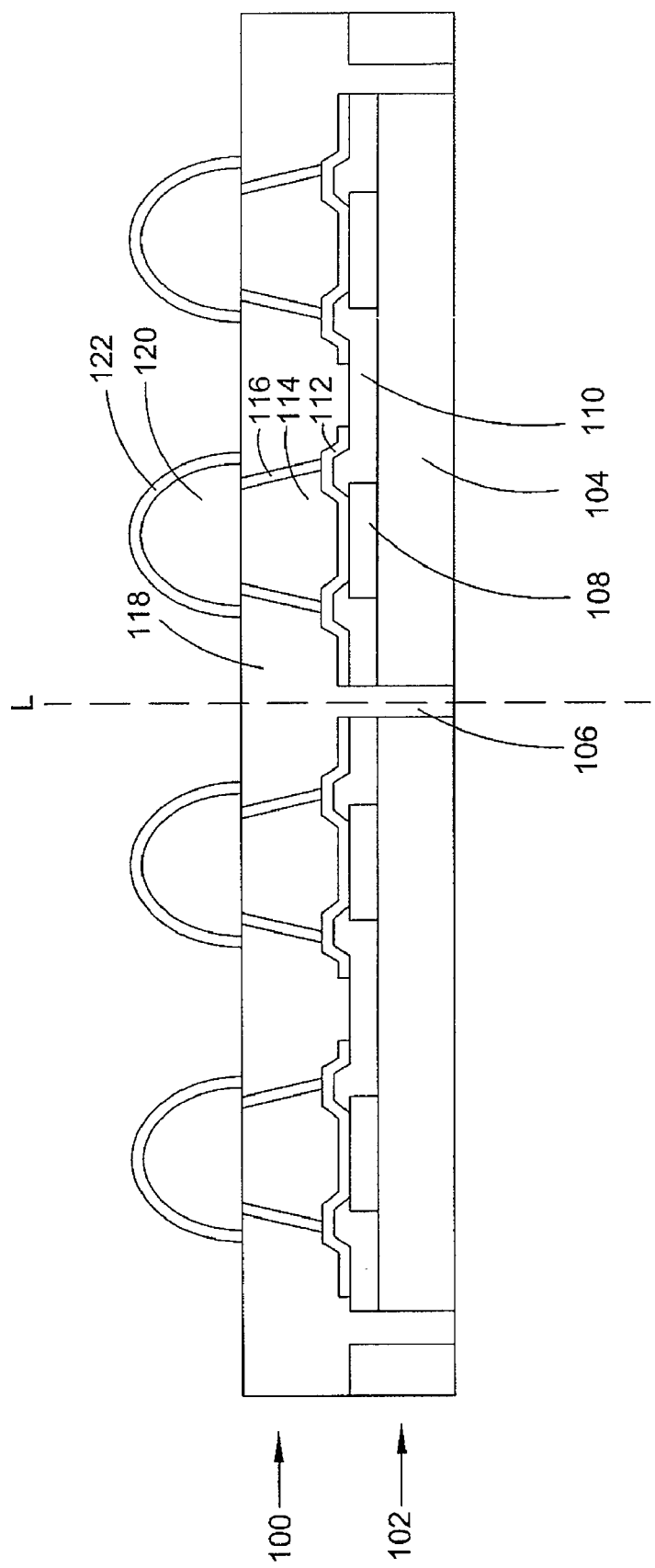

Referring to FIG. 1G, after the package structure 100 is formed, at least one portion of the wafer 102 can be removed. Then, the wafer 102 is cut at the groove 106 to obtain a plurality of packaged chips. For example, the plurality of the packaged chips are separated along the dotted line L. Thus, the insulator layer 108 filled in the groove 106 covers the sidewall of the integrated circuit devices 104, such that the integrated circuit device 104 is more entirely protected.

Figure 1H:
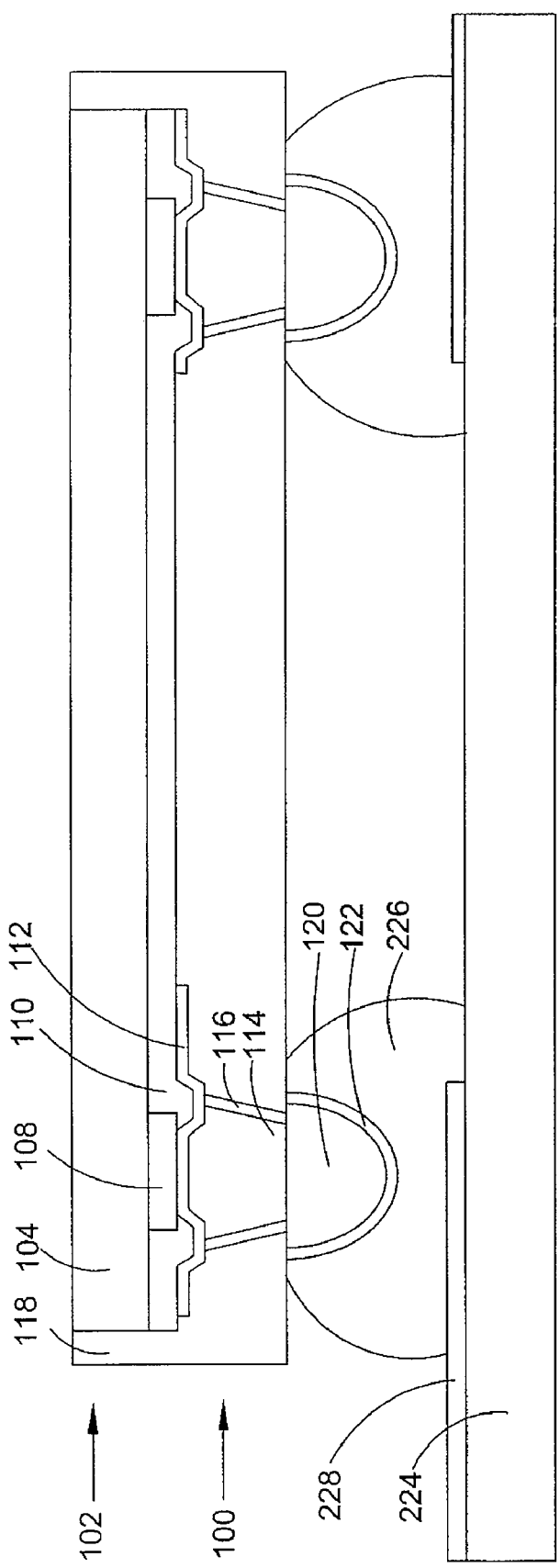

Subsequently, referring to FIG. 1H, the packaged chip may assemble to a substrate 224. The substrate 224 is formed with an interconnect structure 226 and a conductive wire 228. Note that the sidewall of the integrated circuit device 104 is covered by the insulator layer 118, such that the integrated circuit device 114 is more entirely protected. Materials for the interconnect structure 226 may be a solder, a silver paste, or combinations thereof, or any material, which can optionally cover the second conductive bump 120 and the surface metal layer 122 as well as connecting with the substrate 224. The substrate 24 may be a flexible printed circuit (FPC), a printed circuit board (PCB), or a ceramics substrate. Moreover, the assembling step is conducted by bonding the packaged chips with the interconnect structure 226 using a surface mounting technique (SMT).

Although specific embodiments have been illustrated and described, it will be obvious to those skilled in the art that various modifications may be made without departing from what is intended to be limited solely by the appended claims.

The invention claimed is:

1. A package structure for packaging at least one of a plurality of integrated circuit devices of a wafer, said package structure comprising:
   an extension metal pad electrically contacting said at least one of said plurality of integrated circuit devices;
   a first conductive bump on said extension metal pad;
   a second conductive bump on said first conductive bump; and
   an insulator layer over said at least one of said plurality of integrated circuit devices and on a sidewall of said at least one of said plurality of integrated circuit devices,
   wherein at least one of said first metal conductive bump and said second conductive bump comprises a plurality of metal particles and a polymer compound.

2. The package structure of claim 1, wherein said plurality of metal particles comprise copper, nickel, silver, gold, or combinations thereof.

3. The package structure of claim 1, wherein a size of said plurality of metal particles is from 1 to 10 micrometers.

4. The package structure of claim 1, wherein said polymer compound comprises epoxy, a liquid crystal polymer, or combinations thereof.

5. The package structure of claim 1, wherein a volume ratio of said plurality metal particles to said polymer compound is greater than 85:15.

6. The package structure of claim 1, wherein a material of said insulator layer comprises epoxy, polyimide, benzocycle butane, a liquid crystal polymer, or combinations thereof.

7. The package structure of claim 1, further comprising:
   a metal pad between said at least one of said plurality of integrated circuit devices and said extension metal pad, so that said extension metal pad electrically contacts said at least one of said plurality of said integrated circuit devices;
   wherein an area of said extension metal pad is bigger than an area of said metal pad.

8. The package structure of claim 7, further comprising:
   a passivation layer between said at least one of said plurality of integrated circuit devices and said extension metal pad.

* * * * *